US006317376B1

United States Patent
(12) United States Patent
Tran et al.

(10) Patent No.: US 6,317,376 B1
(45) Date of Patent: Nov. 13, 2001

(54) REFERENCE SIGNAL GENERATION FOR MAGNETIC RANDOM ACCESS MEMORY DEVICES

(75) Inventors: Lung T. Tran, Saratoga, CA (US); Kenneth J. Eldredge, Boise, ID (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/598,671

(22) Filed: Jun. 20, 2000

(51) Int. Cl.[7] .............................. G11C 7/02; G11C 11/00
(52) U.S. Cl. .......................... 365/210; 365/158; 365/171
(58) Field of Search .................................... 365/210, 158, 365/209, 207, 171, 173

(56) References Cited

U.S. PATENT DOCUMENTS 5,852,574 * 12/1998 Naji ..................................... 365/158
5,936,906 * 8/1999 Tsen ..................................... 365/210
5,943,286 * 8/1999 Orita .............................. 365/230.03
6,055,178 * 4/2000 Naji ..................................... 365/158
6,111,781 * 8/2000 Naji ..................................... 365/158
6,128,239 * 10/2000 Perner ................................. 365/209
6,185,143 * 2/2001 Perner et al. ........................ 365/210

* cited by examiner

*Primary Examiner*—Michael Lebentritt
*Assistant Examiner*—Anh Phung

(57) ABSTRACT

A Magnetic Random Access Memory ("MRAM") device includes an array of memory cells. The device generates reference signals that can be used to determine the resistance states of each memory cell in the array, despite variations in resistance due to manufacturing tolerances and other factors such as temperature gradients across the array, electromagnetic interference and aging.

17 Claims, 7 Drawing Sheets

200
202
(j)
204
206
208
216
218
STEERING CIRCUIT
ROW DECODER
Vs
224
I/O
256
SA
Is
Ir
251
252
253
254

300
321
S/H
SWITCH CONTROL LOGIC
334
320
SA
324
322
330
326
332
328
302(j)
304
306
308
318
STEERING CIRCUIT
319
AMP
Is
Vs
336
WRITE CIRCUIT

400
SA
320
S/H
421
SWITCH
CONTROL
LOGIC
436
434
422
426
424
432
430
428
302
304
306
308
STEERING CIRCUIT
318
AMP
319
Is
Vs
WRITE
CIRCUIT
336

STAGE
SWITCH 1
SWITCH 2
SWITCH 3
SWITCH 4
SENSE AMP
READ DATA
WRITE 0
READ 0
WRITE 1
READ 1
RESTORE
CLOSE
OPEN
CLOSE
OPEN
OPEN
CLOSE
OPEN
OPEN
CLOSE
OPEN
OPEN
CLOSE
OPEN
WAIT
COMPARE
T0
T1
T2
T3
T4
T5
T6
T7
TIME

REFERENCE SIGNAL GENERATION FOR MAGNETIC RANDOM ACCESS MEMORY DEVICES

BACKGROUND OF THE INVENTION

The present invention relates to random access memory for data storage. More specifically, the present invention relates to a magnetic random access memory device including an array of memory cells and circuitry for sensing resistance states of the memory cells.

Magnetic Random Access Memory ("MRAM") is a non-volatile memory that is being considered for long-term data storage. Performing read and write operations in MRAM devices would be orders of magnitude faster than performing read and write operations in conventional long-term storage devices such as hard drives. In addition, the MRAM devices would be more compact and would consume less power than hard drives and other conventional long-term storage devices.

A typical MRAM device includes an array of memory cells. Word lines extend along rows of the memory cells, and bit lines extend along columns of the memory cells. Each memory cell is located at a cross point of a word line and a bit line.

A memory cell stores a bit of information as an orientation of a magnetization. The magnetization of each memory cell assumes one of two stable orientations, or states, at any given time. These two stable orientations, parallel and anti-parallel, may represent logic values of '0' and '1.'

The magnetization orientation affects the resistance of a memory cell. For instance, resistance of a memory cell is a first value R if the magnetization orientation is parallel, and the resistance of the memory cell is a second value R+ΔR if the magnetization orientation is anti-parallel. The magnetization orientation of a selected memory cell and, therefore, the logic state of the memory cell may be read by sensing the resistance state of the memory cell.

The resistance state of a selected memory cell may be read by applying a sense voltage to a word line crossing the selected memory cell and sensing a current on a bit line crossing the selected memory cell. The sense current (Is) is the ratio of the sense voltage (Vs) and the resistance of the selected memory cell (R or R+ΔR). Thus, the sense current should be about equal to either $Is_0=Vs/R$ or $Is_1=Vs/(R+\Delta R)$. The sense current may be converted to a voltage. The resistance state of the selected memory cell may be determined by comparing the data voltage to a reference voltage (Vref). For example, the logic value stored in the selected memory cell is a logic '0' if the data voltage is greater than the reference voltage (that is, Vdata>Vref), and the logic value is a logic '1' if the data voltage is less than the reference voltage (that is, Vdata<Vref).

Generating reference signals for a large cross point resistive MRAM array is a complicated task. There is a loading effect of unselected memory cells. There are also "sneak paths" in the resistive array. Further, if manufacturing tolerances are not controlled adequately, there will be significant variations in memory cell resistances across the array. Consequently, a reference signal that is used by one group of memory cell might not be usable by another group of memory cells.

Generating the reference signals becomes increasingly complicated as device geometry is reduced. As the geometry is reduced, it becomes increasingly difficult to control manufacturing tolerances. Yet it is a goal of device manufacturers to decrease device geometry. Moreover, resistance variations can result from temperature gradients across the array, surrounding electro-magnetic noise, and physical effects such as aging.

There is a need to establish reliable reference signals for the memory cells of an MRAM array.

SUMMARY OF THE INVENTION

This need is met by the present invention. According to one aspect of the present invention, a memory device includes an array of memory cells; a first storage device for storing a logic '1'; a second storage device for storing a logic '0'; a sense amplifier; and a circuit for generating a reference signal for the sense amplifier. The circuit generates the reference signal by combining outputs of the first and second storage devices.

Other aspects and advantages of the present invention will become apparent from the following detailed description, taken in conjunction with the accompanying drawings, illustrating by way of example the principles of the present invention.

DETAILED DESCRIPTION OF THE INVENTION

Figure 1:
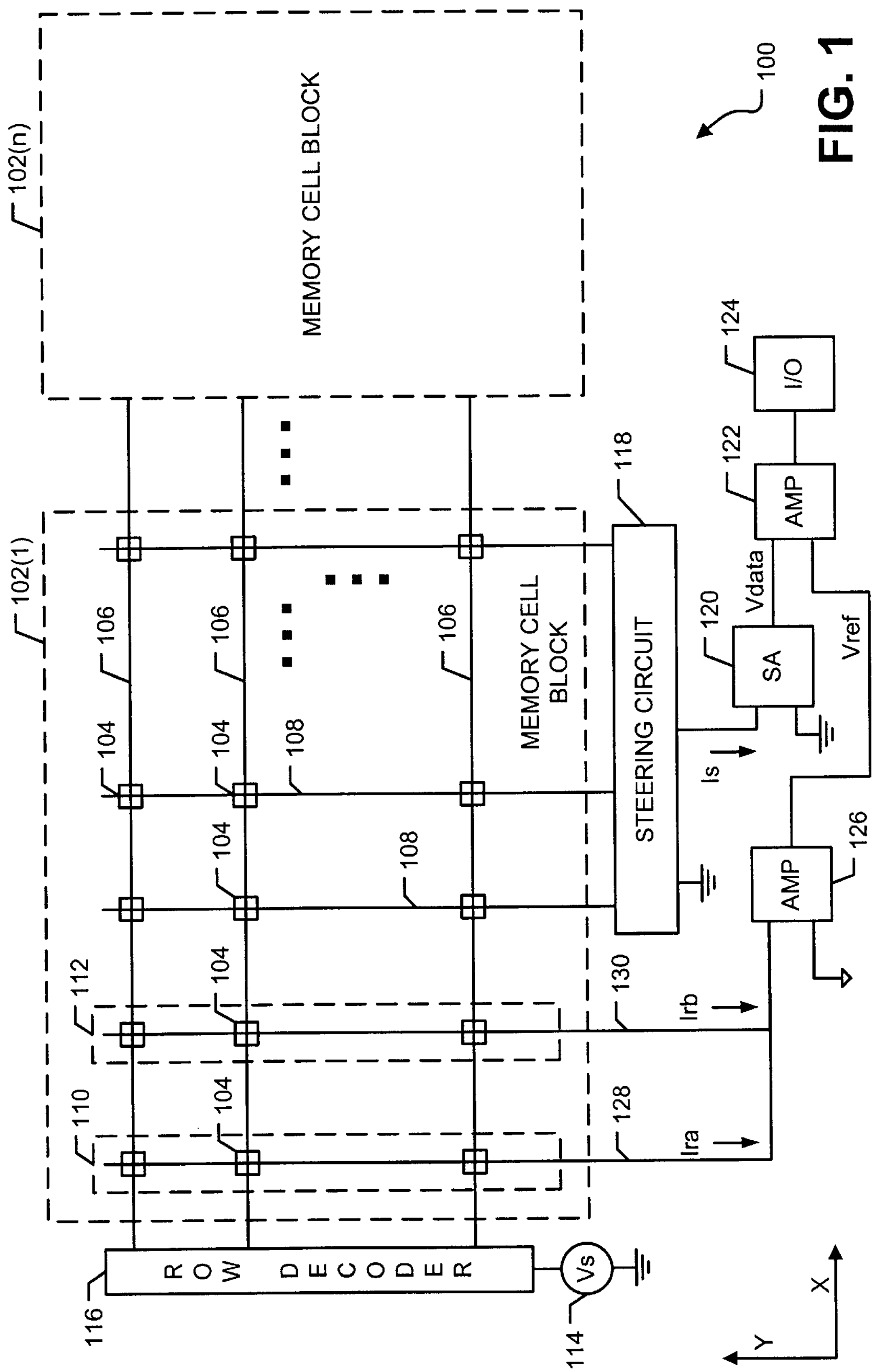
FIG. 1 is an illustration of an MRAM device according to the present invention.

As shown in the drawings for purposes of illustration, the present invention is embodied in an MRAM device including an array of memory cells and a circuit. The circuit can generate reference signals that are usable by the memory cells in the array, despite variations in resistance due to manufacturing tolerances and other factors such as temperature gradients across the array, electromagnetic interference and aging. Four different MRAM devices will be described below. First and second MRAM devices 100 and 200, shown in FIGS. 1 and 3, include reference cells that are used to generate reference signals. Third and fourth MRAM devices 300 and 400, shown in FIGS. 5 and 7, include capacitors that are used to generate the reference signals.

Embodiment 1

Referring to FIG. 1, the first MRAM device 100 includes an array of memory cells 104. The memory cells 104 are typically arranged in rows and columns, with the rows extending along an x-direction and the columns extending along a y-direction. The array may have any number of rows and columns of memory cells.

The memory cells 104 are organized in contiguous blocks 102(1) to 102(n). FIG. 1 shows the first block 102(1) in some detail. Only a few rows and columns of memory cells 104 are shown. The $n^{th}$ block 102(n) is shown in phantom. Blocks 102(2) to 102(n−1) between the first and $n^{th}$ blocks are not shown.

Word lines 106 extend along the x-direction in a plane on one side of the memory cell array 102. Bit lines 108 extend along the y-direction in a plane on another side of the memory cell array 102. Each memory cell 104 is located at the cross point of a word line 106 and a bit line 108.

Each memory cell 104 has two stable resistance states $R_0$ and $R_1$, where $R_0 \cong R_1$. For example, a first resistance state $R_0$ corresponds to the logic value '0' and a second resistance state $R_1$ corresponds to the logic value '1'. The resistance state of a selected memory cell 104 may be set by exposing the selected memory cell to external magnetic fields. The external magnetic fields may be generated by supplying write currents to the word and bit lines 106 and 108 crossing the selected memory cell 104.

Two columns 110 and 112 in each block are reserved as reference columns. Each reference cell 104 of the first reference column 110 always stores a logic '1' and each reference cell 104 of the second reference column 112 always stores a logic '0'. The memory cells 104 in the remaining columns of each block store user data. Each word line 106 crosses a row of memory cells 104 that store user data, as well as a memory cell 104 in the first reference column 110 and a memory cell 104 in the second reference column 112. Thus, each word line 106 crosses a row including a memory cell 104 that always stores a logic '0', a memory cell 104 that always stores a logic '1' and multiple memory cells 104 for storing user data. The memory cells 104 in the reference columns 110 and 112 have the same construction as the memory cells 104 that store user data.

Although the reference columns 110 and 112 are shown as being the first and second columns of the first block 102(1), they are not so restricted. The reference columns 110 and 112 may occupy any positions within a memory cell block 102.

The first MRAM device 100 further includes a row decoder 116 for selecting a word line 106 during a read operation. The word line 106 may be selected by applying a sense voltage Vs to it. The sense voltage Vs may be provided by a voltage source 114.

The MRAM device 100 further includes a steering circuit 118 and a sense amplifier 120 for each block 102(*j*). Multiple bit lines 108 are connected to each steering circuit 118. Each steering circuit 118 includes a set of switches that connect a selected bit line to a sense input of the sense amplifier 120. Other unselected bit lines are connected to a ground potential. An output of the sense amplifier 120 is supplied to a second amplifier 122, which, in turn, is coupled to an I/O pad 124 of the MRAM device 100.

A half-gain amplifier 126 is also provided for each block 102(*j*). A reference input of the half-gain amplifier 126 is connected to a first bit line 128 crossing the memory cells 104 of the first reference column 110. The reference input of the half-gain amplifier 126 is also connected to a second bit line 130 crossing the memory cells 104 of the second reference column 112.

Figure 2:
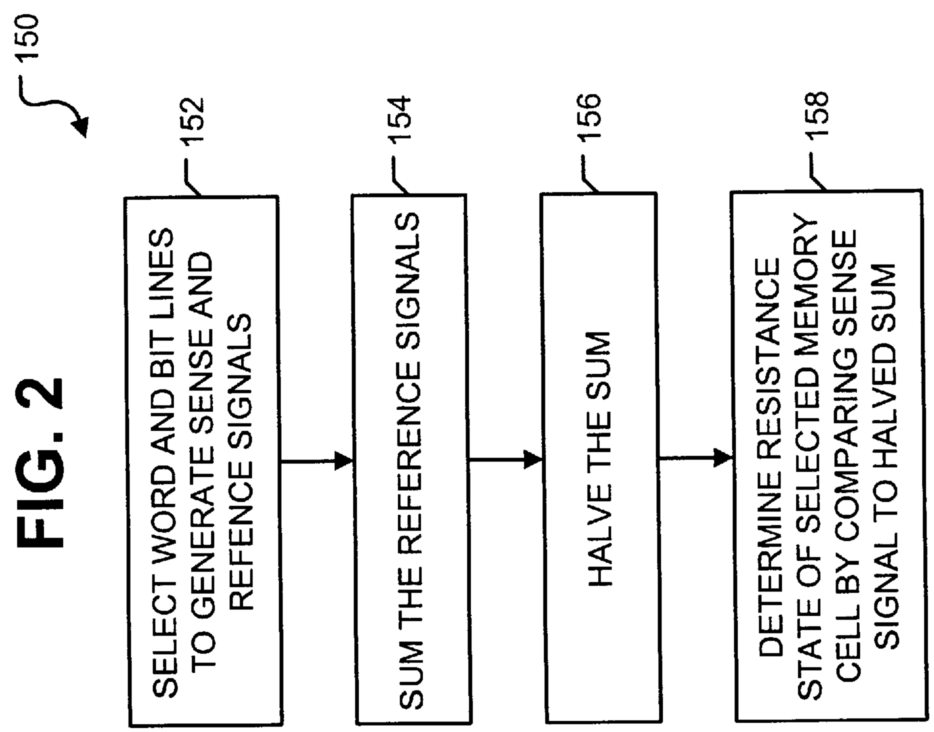
FIG. 2 is a flowchart of a read operation by the device shown in FIG. 1.

Additional reference is now made to FIG. 2, which shows a flow chart 150 illustrating a read operation by the first MRAM device 100. At the beginning of the read operation, a word line 106 and a bit line 108 are selected (block 152). Selecting the word and bit line 106 and 108 causes a sense current Is to flow through the selected word and bit lines 106 and 108. The sense current Is also flows though the memory cell 104 at the cross point of the selected word and bit lines 106 and 108. For example, the row decoder 116 may select a word line 106 by applying a sense voltage Vs to that word line 106, and the steering circuit 118 may select a bit line 108 by applying a virtual ground potential to that bit line 108. Other unselected bit lines are connected to a ground potential by the steering circuit 118. The row decoder 116 and the steering circuit 118 make the selections in response to row and column addresses.

The sense current Is is supplied to the sense input of the sense amplifier 120. Magnitude of the sense current is inversely proportional to the resistance state (and, therefore, logic state) of the selected memory cell 104. The sense amplifier 120, which has a feedback resistor (Rf), converts the sense current Is to a data voltage Vdata. An output of the sense amplifier 120 provides the data voltage Vdata to an input of the second amplifier 122.

Applying a sense voltage Vs to the selected word line 106 also causes a first reference current Ira to flow through the memory cell 104 at the cross point of the selected word line 106 and the bit line 128 crossing the first reference column 110. Similarly, applying the sense voltage Vs causes a second reference current Irb to flow through the memory cell 104 at the cross point of the selected word line 106 and the bit line 130 crossing the second reference column 112. Thus, reference cells 104 in the reference columns 110 and 112 are selected when a word line 106 is selected. Because the reference cell 104 in the first reference column 110 stores the logic '1' (and therefore has a resistance $R_1$), the first reference current Ira equals $Vs/R_1$. Because the reference cell 104 in the second reference column 112 stores the logic '0' (and therefore has a resistance $R_0$), the second reference current Irb equals $Vs/R_0$.

The reference currents Ira and Irb are supplied to the reference input of the half-gain amplifier 126. The reference currents Ira and Irb are summed by the half-gain amplifier 126 (block 154), and the sum is halved and converted into a reference voltage Vref by the half-gain amplifier 126 (block 156). Thus, Vref=(Ira+Irb)Rf/2. An output of the half-gain amplifier 126 provides the reference voltage Vref.

The second amplifier 122 compares the data voltage Vdata to the reference voltage Vref. The comparison indicates whether the selected memory cell 104 stores a logic '1' or a logic '0' (block 158).

Using first and second reference columns 110 and 112 in each block is based on an assumption that variations in resistance values of the memory cells are a function of distance across the array. That is, memory cells 104 that are closer together will have less variation in resistance states than memory cells 104 that are farther apart. Thus, the first and second columns 110 and 112 of each memory cell block 102(*j*) (where $1 \leqq j \leqq n$) are localized with respect to memory cells 104 that store user data. Moreover, the reference cells in the reference cell columns 110 and 112 form a part of the memory cell block 102(*j*). Consequently, any variations in the word line 106 or loading effect of other unselected memory cells within the block 102(*j*) will have similar effects on the reference cells in the same block 102(*j*). Therefore, the selected memory cell and the reference cells in the reference cell columns 110 and 112 of the same block 102(*j*) tend to track one another for better common mode rejection of noise and temperature. Resulting is a more reliable determination of the resistance states of the selected memory cells.

Embodiment 2

Figure 3:
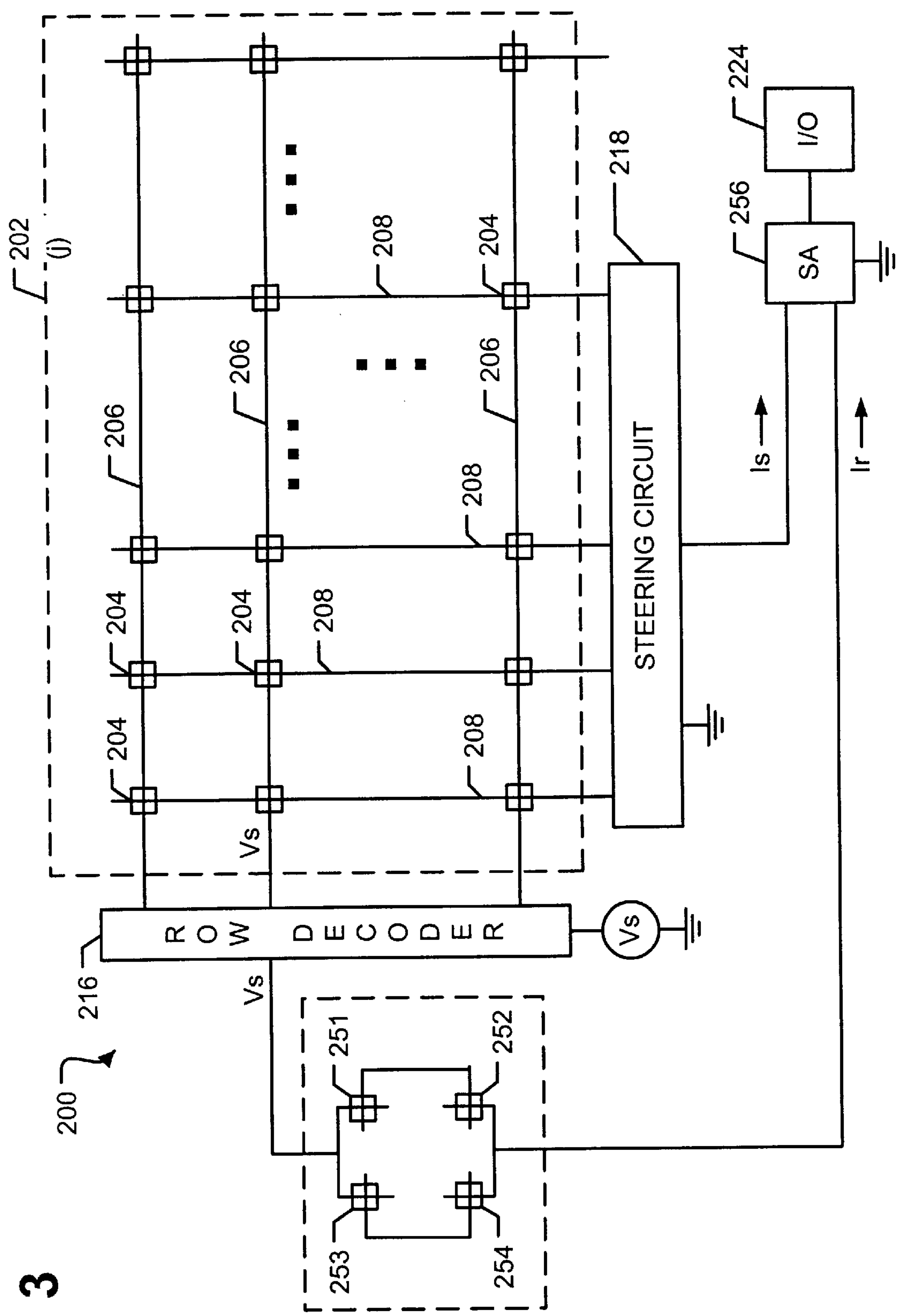
FIG. 3 is an illustration of another MRAM device according to the present invention.

FIG. 3 shows the second memory device 200, which is similar to the first memory device 100. The second memory device 200 includes an array of memory cells 204, word lines 206 crossing rows of the memory cells 204 and bit lines 208 crossing columns of the memory cells 204. The memory cells 204 are organized in blocks 202(1) to **202(*n*). Only one block 202(*j*) is shown in FIG. 3**.

For each block **202(*j*) of the second device 200, there is a first pair of reference cells 251 and 252 connected in series and second pair of reference cells 253 and 254 connected in series. The first pair of reference cells 251/252 is connected in parallel to the second pair of reference cells 253/254. The reference cells 251/252 of the first pair always store a logic '0' and a logic '1' and have resistances of $R_{0a}$ and $R_{1a}$, respectively. The reference cells 253/254 of the second pair always store a logic '0' and a logic '1' and have resistances of $R_{0b}$ and $R_{1b}$, respectively. Thus, the combined resistance of Rref of the four reference cells 251, 252, 253 and 254** is about $(R_{0a}+R_{1a})(R_{0b}+R_{1b})/(R_{0a}+R_{1a}+R_{0b}+R_{1b})$. If $R_0=R_{0a}=R_{0b}$ and $R_1=R_{1a}=R_{1b}$, then $Rref=(R_0+R_1)/2$, whereby the reference resistance Rref is mid-way between the resistances $R_0$ and $R_1$.

The reference cells 251, 252, 253 and 254 are all made of the same material and all have the same size as the memory cells in their corresponding block **202(*j*). Moreover, the reference cells 251, 252, 253 and 254 are located in the vicinity of their corresponding block 202(*j*)**.

The reference cell pairs 251/252 and 253/254 are coupled between a row decoder 216 and a reference input of a sense amplifier 256. The row decoder 216 applies a sense voltage Vs to the reference cells 251, 252, 253 and 254 during a read operation on a selected memory cell within the block **202(*j*). A steering circuit 218 is coupled between the bit lines 208 and a sense input of the sense amplifier 256. An output of the sense amplifier is coupled to an I/O pad 224**.

Figure 4:
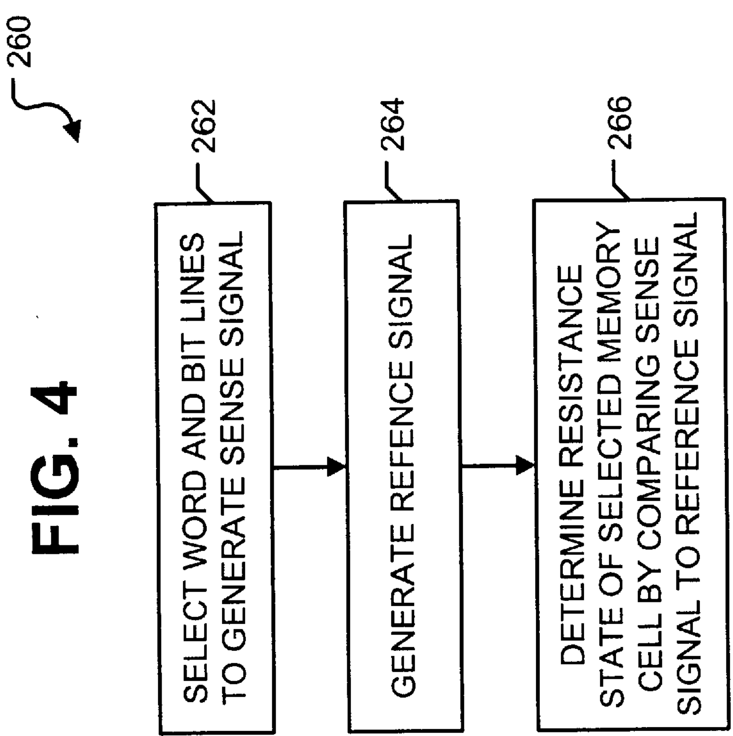
FIG. 4 is a flowchart of a read operation by the device shown in FIG. 3.

Additional reference is now made to FIG. 4, which shows a flow chart 260 illustrating a read operation in the second MRAM device 200. At the beginning of the read operation, a word line 206 and a bit line 208 are selected (block 262), whereby the row decoder 216 applies a sense voltage Vs to the selected word line 206 and the steering circuit 218 connects the selected bit line 208 to the sense amplifier 256 and all unselected bit lines to ground. A sense current Is flows through a selected memory cell and the selected bit line to the sense input of the sense amplifier 256. At the same time, the row decoder 216 also applies a sense voltage Vs to the reference cell pairs 251/252 and 253/254 (block 264), whereby a reference current Ir flows to the reference input of the sense amplifier 256. The reference current Ir is equal to Vs/Rref.

The sense amplifier 256 compares the sense signal Is to the reference signal Ir. The comparison indicates whether the selected memory cell 204 stores a logic '1' or a logic '0' (block 266).

Embodiment 3

Figure 5:
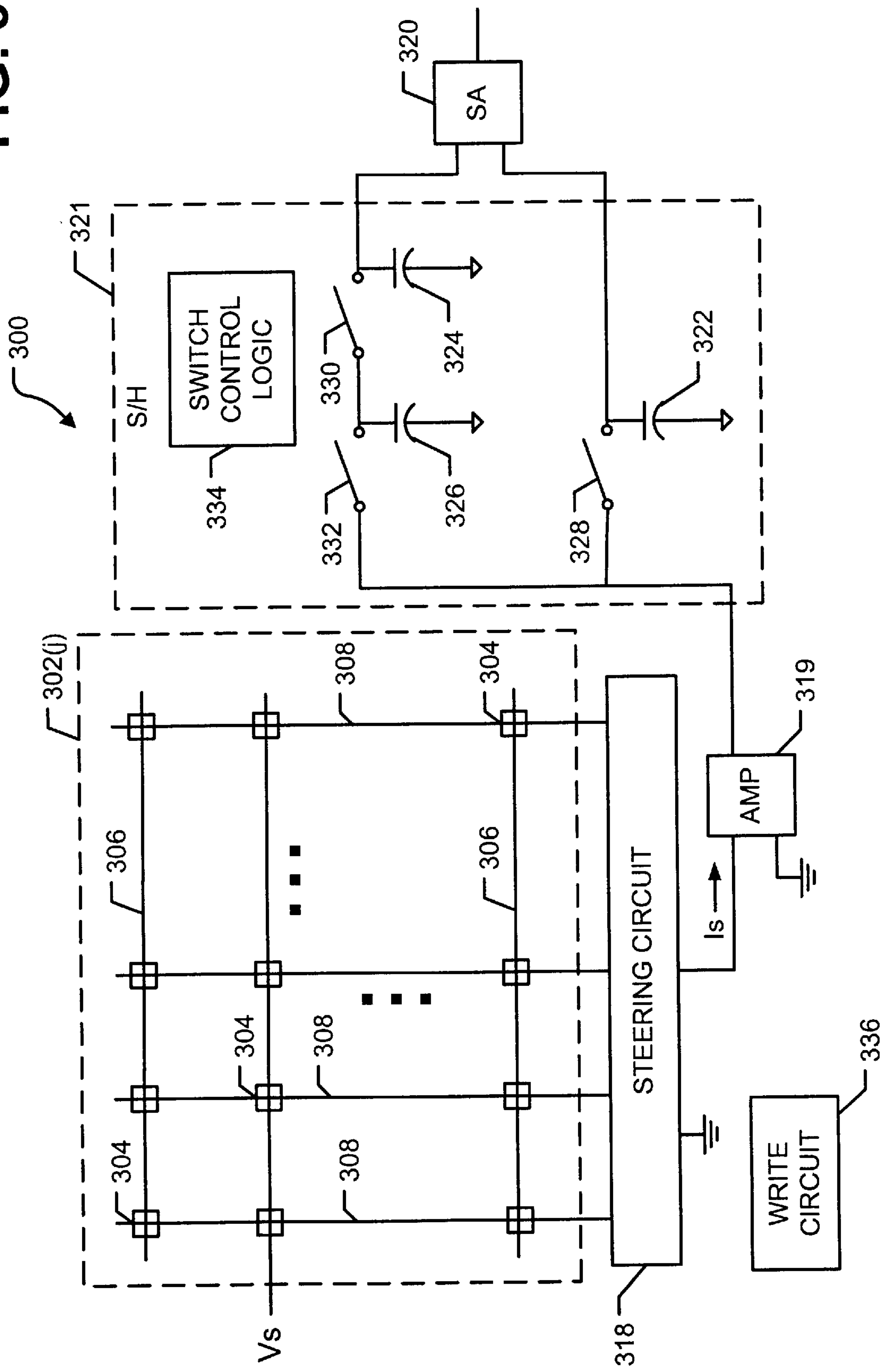
FIG. 5 is an illustration of yet another MRAM device according to the present invention.

FIG. 5 shows the third memory device 300, which includes an array of memory cells 304, word lines 306 crossing rows of the memory cells 304 and bit lines 308 crossing columns of the memory cells 304. Only a single memory cell block **302(*j*) is shown in FIG. 5. The third memory device 300 further includes a steering circuit 318, a first amplifier 319, a sense (second) amplifier 320 and a sample and hold ("S/H") 321 for each memory cell block 302(*j*)**.

The steering circuit 318 couples a selected bit line to an input of the first amplifier 319 and it couples unselected bit lines of the memory cell block **302(*j*) to a ground potential. The S/H 321 includes a first capacitor 322 (which functions as data signal storage device), a second capacitor 324 (which functions as a first reference signal storage device) and a third capacitor 326 (which functions as a second reference signal storage device). The first capacitor 322 is coupled to an output of the first amplifier 319 by a first switch 328. The second capacitor 324 is coupled to the first amplifier 319 by second and third switches 330 and 332. The third capacitor 326 is coupled to the steering circuit output by the third switch 332. The first capacitor 322 is coupled to a sense input of the sense amplifier 320. The second capacitor 322 is coupled to a reference input of the sense amplifier 320**.

The S/H 321 is not necessarily local to the memory cells being sensed. The S/H 321 may be formed on a silicon substrate of the third device 300.

The S/H 321 further includes control logic 334 for the switches 328, 330 and 332. The control logic 334 controls the switches 328, 330 and 332 during a read operation on a selected memory cell, as indicated in FIG. 6.

Each block **302(*j*) of the third device 300 also includes a write circuit 336. During a write operation on a selected memory cell, the write circuit 336 applies a first write current to the selected word line and a second write current to the selected bit line. All other lines are left unconnected. Each write current produces a magnetic field at the selected memory cell. The combined magnetic fields set the selected memory cell to the low resistance state $R_0$ or the high resistance state $R_1$, depending upon the write current direction on the bit line 308**. Although the read and write circuits are shown as separate circuit, they may be integrated.

Figure 6:
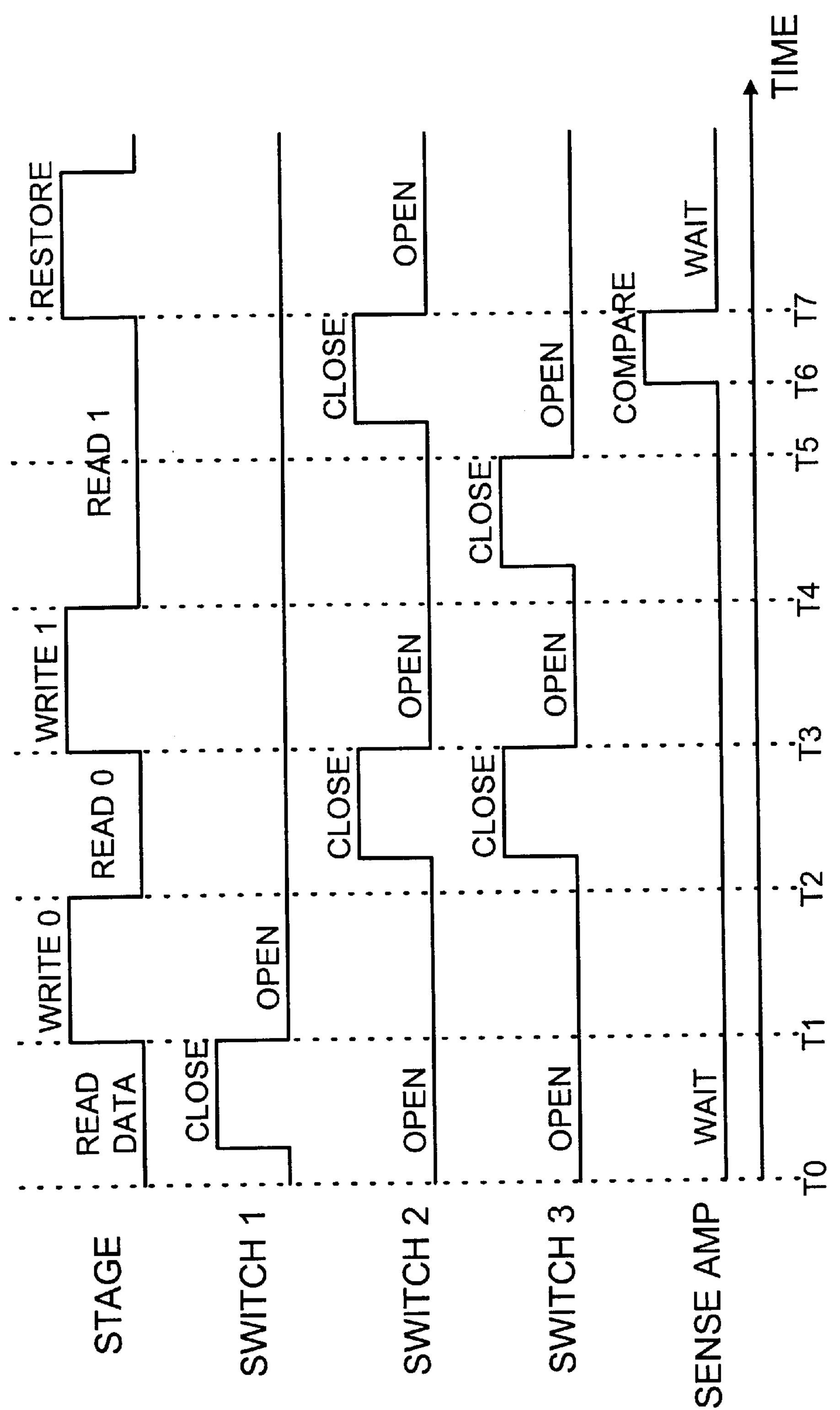
FIG. 6 is a timing diagram for the device shown in FIG. 5.

Reference is now made to FIG. 6. At time T0, a word line 306 and a bit line 308 are selected, whereby a sense signal flows through a selected memory cell 304. Magnitude of the sense signal depends upon the resistance state of the selected memory cell 304. At time T0, all three switches 328, 330 and 332 are open.

Immediately following time T0, the first switch 328 is closed to allow the first amplifier 319 to charge the first capacitor 322 to a voltage Vdata. At time T1, the first switch 322 is opened. The voltage Vdata at time T1 represents the resistance state of the selected memory cell 304.

At time T1, a logic '0' is written to the selected memory cell 304. Thus, the resistance of the selected memory cell 304 is set to $R_0$.

At time T2, the selected memory cell 304 is read again by selecting the crossing word and bit lines 306 and 308. Consequently, a sense signal flows through the selected memory cell 304.

After time T2, the second and third switch 330 and 332 are closed to allow the second and third capacitors 324 and 326 to charge to voltage $V_0$. The voltage $V_0$ at time T3 represents a logic '0' stored in the selected memory cell 104.

At time T3, the second and third switches 330 and 332 are opened, and a logic '1' is written to the selected memory cell 304. Thus, the resistance of the selected memory cell is set to $R_1$.

At time T4, the selected memory cell 304 is read again by selecting the crossing word and bit lines 306 and 308. Consequently, a sense signal flows through the selected memory cell 304.

After time T4, the third switch 332 is closed to charge the third capacitor 326 to voltage $V_1$. At time T5, the third switch 332 is opened. The voltage $V_1$ at time T5 represents a logic '1' stored in the selected memory cell 304.

After time T5, the second switch 330 is closed, thereby allowing the charge on the second capacitor 324 and the charge on the third capacitor 326 to equalize to a reference voltage Vref. The transfer of charge between the second and third capacitors 324 and 326 can occur very quickly.

At time T6, the reference voltage Vref is available to the reference input of the sense amplifier 320. The voltage Vdata on the first capacitor 322 is applied to the sense input of the sense amplifier 320. The sense amplifier 320 compares the voltage Vdata to the reference voltage Vref to determine whether a logic '0' or a logic '1' was stored in the selected memory cell.

At time T7, the logic value is restored to the selected memory cell 304. Thus, if a logic '0' was sensed, the write circuit 336 writes a logic '0' to the selected memory cell 304. If a logic '1' was sensed, the write circuit 336 writes a logic '1' to the selected memory cell 304.

Embodiment 4

Figure 7:
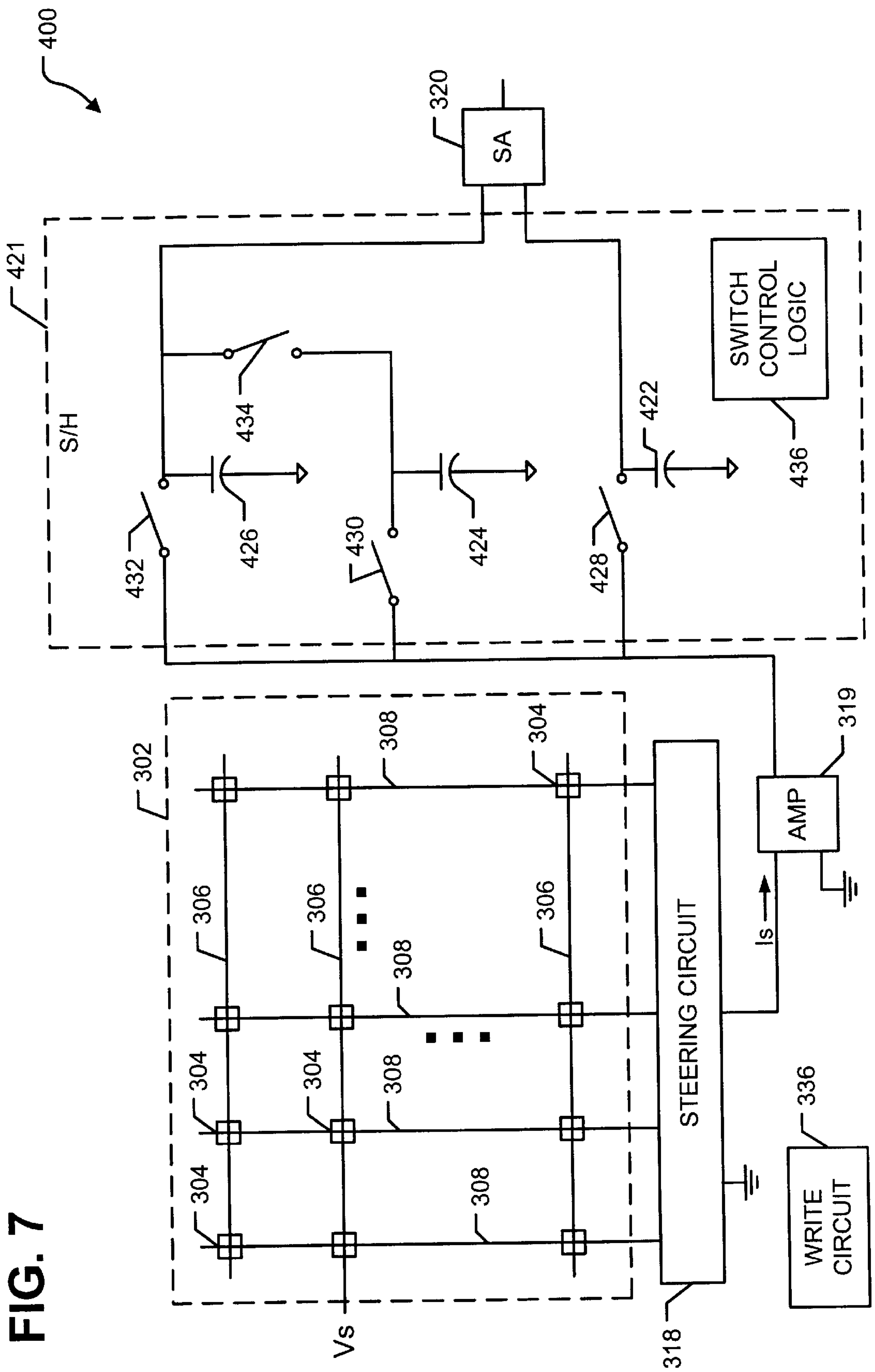
FIG. 7 is an illustration of still another MRAM device according to the present invention.

FIG. 7 shows the fourth memory device 400, which is identical to the third memory device 300, except for the S/H 421. The S/H 421 of the fourth device 400 includes a first capacitor 422 (which functions as a data storage device), a second capacitor 424 (which functions as a first reference signal storage device), and a third capacitor 426 (which functions as a second reference signal storage device).

The first capacitor 422 is coupled to the first amplifier output by a first switch 428. The second capacitor 424 is coupled to the first amplifier output by a second switch 430. The third capacitor 426 is coupled to the first amplifier output by a third switch 432. A fourth switch 434 couples the second capacitor 424 to the third capacitor 426.

The first capacitor 422 is connected to a sense input of the sense amplifier 320. The third capacitor 426 is connected to the reference input of the sense amplifier 320.

The S/H 421 further includes control logic 436 for controlling the switches 428, 430, 432 and 434 during a read operation on a selected memory cell 304. Control of the switches 428, 430, 432 and 434 is illustrated in FIG. 8.

Figure 8:
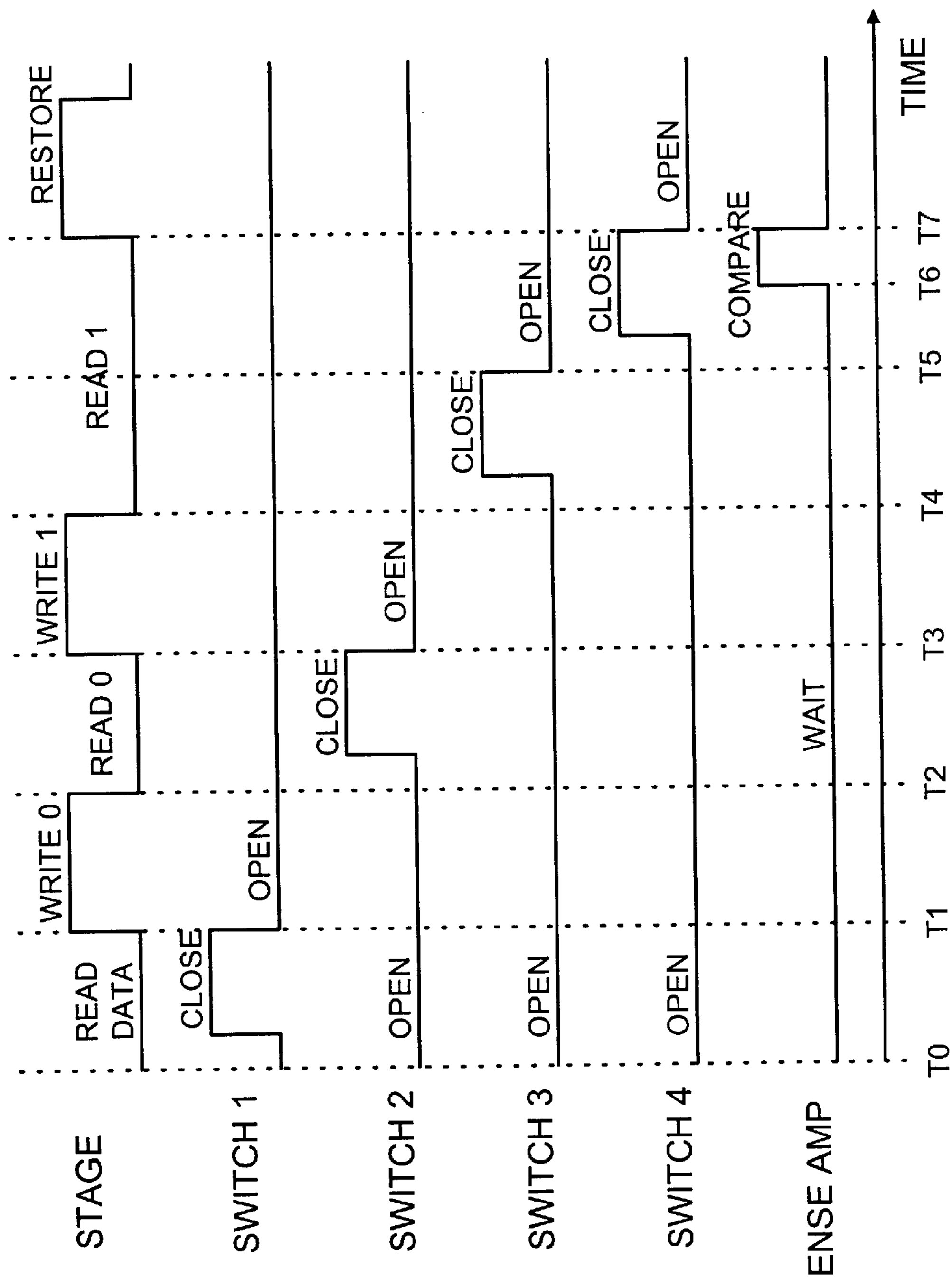
FIG. 8 is a timing diagram for the device shown in FIG. 7.

Reference is now made to FIG. 8. At time T0, a word line 306 and a bit line 308 are selected, whereby a sense signal flows through a selected memory cell 304. Magnitude of the sense signal depends upon the resistance state of the selected memory cell 304. At time T0, all four switches 428, 430, 432 and 434 are open.

Immediately following time T0, the first switch 428 is closed to allow the sense current to charge the first capacitor 422 to a voltage Vdata.

At time T1, the first switch 428 is opened. The voltage Vdata at time T1 represents the resistance state of the selected memory cell 304.

Also at time T1, a logic '0' is written on the selected memory cell 304. Thus, the resistance of the selected memory cell 304 is set to $R_0$.

At time T2, the selected memory cell 304 is read again by selecting the crossing word and bit lines 306 and 308. Consequently, a sense signal flows through the selected memory cell 304.

Following time T2, the second switch 430 is closed to allow the second capacitor 424 to charge to voltage $V_0$.

At time T3, the second switch 430 is opened, and a logic '1' is written to the selected memory cell 304. Thus, the resistance of the selected memory cell 304 is set to $R_1$.

At time T4, the selected memory cell 304 is read again by selecting the crossing word and bit lines 306 and 308. Consequently, a sense signal flows through the selected memory cell 304.

Following time T4, the third switch 432 is closed to allow the third capacitor 426 to charge to voltage $V_1$. At time T5, the third switch 432 is opened.

Following time T5, the fourth switch 434 is closed, thereby allowing the charge on the second capacitor 424 and the charge on the third capacitor 426 to equalize to a reference voltage Vref. The equalized voltage Vref is about midway between $V_0$ and $V_1$. That is, $Vref \approx (V_0+V_1)/2$. The reference voltage Vref is applied to the reference input of the sense amplifier 320.

At time T6, the reference voltage Vref is available to the reference input of the sense amplifier 320. The sense amplifier 320 compares the voltage Vdata on the first capacitor 422 to the reference voltage Vref to determine whether the selected memory cell 304 stored a logic '0' or a logic '1'. At time T7, the sensed logic value of the selected memory cell is restored to the selected memory cell.

Thus disclosed are MRAM devices that generate usable reference signals, despite variations in resistance due to manufacturing tolerances and other factors such as temperature gradients across the array, electromagnetic interference and aging. The first and second devices can perform read operations faster than the third and fourth devices. However, the third and fourth devices have much more robust reference signals to determine the logic states of selected memory cells because the reference signals are derived from the selected memory cells.

The signal storage devices in FIGS. 5 and 7 are not limited to capacitors. For example, the signal storage devices may be digital counters.

The memory cells are not limited to any particular type. For example, the memory cells may be, without limitations, spin dependent tunneling ("SDT") junction devices or giant magnetoresistance ("GMR") devices.

The sense amplifiers are not limited to any particular type. Exemplary sense amplifiers are disclosed in assignee's U.S. Pat. Nos. 6,259,644 and 6,188,615.

Although several specific embodiments of the present invention have been described and illustrated, the present invention is not limited to the specific forms or arrangements of parts so described and illustrated. Instead, the present invention is construed according to the claims the follow.

What is claimed is:

1. A memory device comprising:

a block of memory cells;

a first storage device for storing a logic '1';

a second storage device for storing a logic '0';

a sense amplifier; and a circuit for generating a reference signal for the sense amplifier, the circuit generating the reference signal by combining outputs of the first and second storage devices.

2. The device of claim 1, wherein the first storage device includes a first group of reference cells for the memory cells in the block; wherein the second storage device includes a second group of reference cells for the memory cell block; and wherein the circuit generates the reference signal by combining the outputs from the first and second reference cell groups; the first and second groups being local to the block of memory cells.

3. The device of claim 2, wherein the first group includes a first column of first reference cells and the second group includes a second column of second reference cells; wherein each memory cell in the array is crossed by a word line, each word line also crossing a first reference cell in the first reference cell group and a second reference cell in the second reference cell column; whereby selecting a word line results in a corresponding pair of first and second reference cells being selected, outputs of the selected reference cell pair being combined by the circuit to generate the reference signal.

4. The device of claim 3, wherein a first bit line crosses the first reference cells in the first column; wherein a second bit line crosses the second reference cells in the second column; and wherein the circuit includes a half gain amplifier having inputs coupled to the first and second bit lines.

5. The device of claim 2, wherein the first group includes a first reference cell for storing a logic '1' and the second group includes a second reference cell for storing a logic '0'; wherein the first and second reference cells are crossed by a trace; and wherein the circuit includes an amplifier having an input coupled to the trace.

6. The device of claim 5, further comprising an additional first reference cell for storing a logic '1', an additional second reference cell for storing a logic '0', and an additional trace crossing the additional reference cells; and wherein the additional trace is also coupled to the amplifier input.

7. The device of claim 2, further comprising an additional first reference cell group, an additional second reference cell group, an additional circuit and an additional sense amplifier for each additional block of memory cells in the array, wherein each additional first reference cell group includes first reference cells for storing a logic '1', each additional second reference cell group includes second reference cells for storing a logic '0', and each additional circuit generates a reference signal for a corresponding sense amplifier by combining outputs of corresponding first and second reference cell groups; and wherein each additional group of reference cells is local to its corresponding memory cell block.

8. The device of claim 1, further comprising a third storage device; and wherein the circuit includes first, second and third switches and control logic for controlling the switches, the control logic causing the first switch to connect a selected memory cell to the third storage device during a first time interval, the control logic causing the second and third switches to connect the first and second storage devices to the selected memory cell during a second time interval, the control logic causing the second switch to connect the selected memory cell to the first storage device during a third time interval, the control logic causing the third switch to equalize signals stored in the first and second storage devices, the equalized signal being the reference signal.

9. The device of claim 1, further comprising a third storage device for storing a logic value of a selected memory cell in the block; and wherein the circuit includes first, second, third and fourth switches and control logic for controlling the switches, the control logic causing the first switch to connect the selected memory cell to the third storage device during a first time interval, the control logic causing the second switch to connect the first storage device to the selected memory cell during a second time interval, the control logic causing the third switch to connect the selected memory cell to the second storage device during a third time interval, and the control logic causing the fourth switch to equalize signals stored in the first and second storage devices during a fourth interval, the equalized signal being the reference signal.

10. A memory device comprising:

a block of memory cells;

first and second reference cells for storing first and second logic states, respectively, the first and second reference cells being proximate the memory cells; and a circuit for generating a reference signal during a read operation on selected memory cells in the block, the circuit generating the reference signal by combining outputs of the first and second reference cells.

11. The memory device of claim 10, wherein the first reference cell includes a plurality of first reference elements storing the first logic value; wherein the second reference cell includes a plurality of second reference elements storing the second logic value; and wherein the circuit selects a first reference element from the first cell and a second reference element from the second cell.

12. The memory device of claim 11, wherein the selected first and second reference elements lie in same row or column as a selected memory cell in the block.

13. The memory device of claim 10, wherein the first reference cell includes a first reference element storing the first logic value, and the second reference cell includes a second reference element storing the second logic value; and wherein the first and second reference cells are coupled in parallel.

14. The memory device of claim 13, wherein the first reference cell further includes a third reference element storing the first logic value, the first and third reference elements connected in series; and wherein the second reference cell further includes a fourth reference element storing the second logic value, the second and fourth reference elements connected in series.

15. A memory device comprising:

a block of memory cells;

first and second storage devices for storing first and second logic states, respectively;

a third storage device for storing a logic value of a selected memory cell in the block; and a circuit for generating a reference signal during a read operation, the circuit generating the reference signal by combining outputs of the first and second storage devices, and comparing the combined output to an output of the third storage device.

16. The device of claim 15, wherein the circuit includes first, second and third switches and control logic for controlling the switches, the control logic causing the first switch to connect the selected memory cell to the third storage device during a first time interval, the control logic causing the second and third switches to connect the first and second storage devices to the selected memory cell during a second time interval, the control logic causing the second switch to connect the selected memory cell to the first storage device during a third time interval, the control logic causing the third switch to equalize signals stored in the first and second storage devices, the equalized signal being used as the reference signal.

17. The device of claim 15, wherein the circuit includes first, second, third and fourth switches and control logic for controlling the switches, the control logic causing the first switch to connect the selected memory cell to the third storage device during a first time interval, the control logic causing the second switch to connect the first storage device to the selected memory cell during a second time interval, the control logic causing the third switch to connect the selected memory cell to the second storage device during a third time interval, and the control logic causing the fourth switch to equalize signals stored in the first and second storage devices during a fourth interval, the equalized signal being used as the reference signal.

* * * * *